United States Patent
Sugimachi

(12) 
(10) Patent No.: US 6,239,500 B1
(45) Date of Patent: May 29, 2001

(54) SEMICONDUCTOR DEVICE WITH COMMON BIT CONTACT AREA

(75) Inventor: Tatsuya Sugimachi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/383,202

(22) Filed: Aug. 26, 1999

(30) Foreign Application Priority Data

Feb. 5, 1999 (JP) ................................. 11-028517

(51) Int. Cl.[7] ................................. H01L 27/108
(52) U.S. Cl. ..................... 257/905; 257/208; 257/211
(58) Field of Search ................... 257/905, 203, 257/207, 208, 211, 390, 758, 401, 296

(56) References Cited

U.S. PATENT DOCUMENTS

| | | | | |
|---|---|---|---|---|
| Re. 36,440 | * | 12/1999 | Lee et al. ........................ | 257/202 |
| 4,651,183 | * | 3/1987 | Lange et al. .................... | 357/23.6 |
| 5,250,831 | * | 10/1993 | Ishii ............................... | 257/354 |
| 5,298,775 | * | 3/1994 | Ohya .............................. | 257/211 |
| 5,770,874 | * | 6/1998 | Egawa ............................ | 257/296 |
| 5,804,854 | * | 9/1998 | Jung et al. ...................... | 257/321 |
| 5,821,592 | * | 10/1998 | Hoenigschmid et al. ........ | 257/390 |
| 6,084,266 | * | 7/2000 | Jan ................................. | 257/341 |

FOREIGN PATENT DOCUMENTS

| | | | | |
|---|---|---|---|---|
| 065599 | * | 5/1981 | (EP) ............................... | 257/321 |
| 2791005 | | 6/1998 | (JP) . | |

* cited by examiner

Primary Examiner—Eddie C. Lee
Assistant Examiner—Lourdes Cruz
(74) Attorney, Agent, or Firm—Armstrong, Westerman, Hattori, McLeland & Naughton, LLP

(57) ABSTRACT

A field insulating film defines a plurality of active regions disposed regularly in terms of two dimension on the surface of a semiconductor substrate. Each active region includes one bit contact region and subsidiary active regions extending from the bit contact region in four directions. A plurality of first word lines are formed which extend as a whole in a first direction on the semiconductor substrate, and a plurality of second word lines are formed which extend as a whole in a second direction on the semiconductor substrate, crossing the first word lines. Two subsidiary active regions cross the first word lines and remaining two subsidiary active regions cross the second word lines. A plurality of bit lines are formed which extend as a whole in the first and second directions on the semiconductor substrate, crossing each other. Each bit contact region is connected to a corresponding one of the bit lines. Four transistors share one bit contact, and these four transistors have different word lines.

14 Claims, 8 Drawing Sheets

FIG.1AA
FIG.1AB
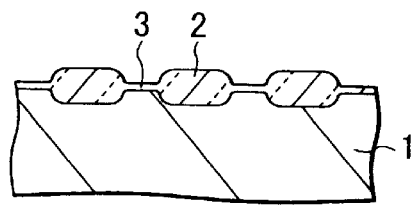
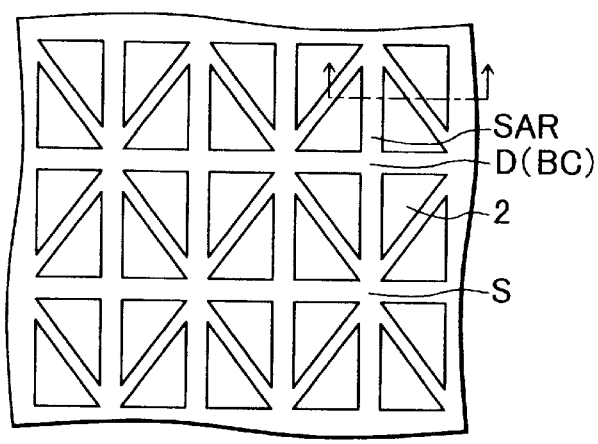
FIG.1BA
FIG.1BB
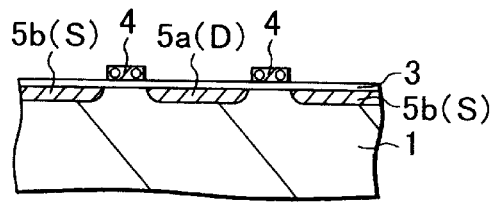
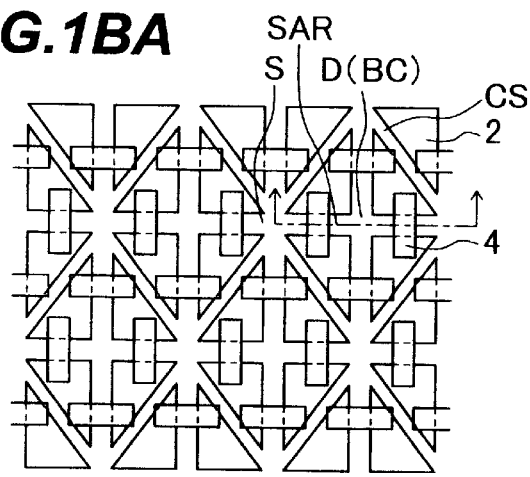
FIG.1CA
FIG.1CB
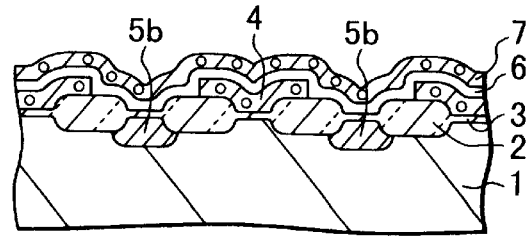
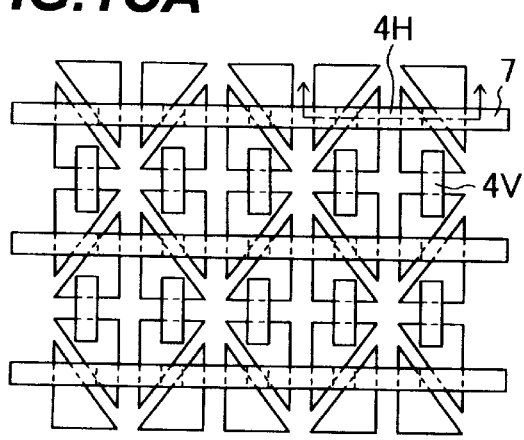

SEMICONDUCTOR DEVICE WITH COMMON BIT CONTACT AREA

This application is based on Japanese Patent Application HEI 11-28517, filed on Feb. 5, 1999, the entire contents of which are incorporated herein by reference.

BACKGROUND OF THE INVENTION

1. Field of the Invention

The present invention relates to a semiconductor device, and more particularly to a semiconductor integrated circuit capable of improving integration degree.

2. Description of the Related Art

In the following, a non-volatile memory will be described as an example which will not give any limitative sense to this invention.

It is always one target of a semiconductor integrated circuit to improve integration degree or density. This target is also applied to non-volatile memories such as EEPROM, flash EEPROM, and mask ROM.

FIGS. 5A and 5B are equivalent circuit diagrams of a NAND type flash EEPROM and a NOR type flash EEPROM. In the NAND circuit shown in FIG. 5A, a plurality of memory transistors T11, T21, ..., T81 of eight bits are serially connected on the left side column, with the source and drain of adjacent transistors being connected in common. Select transistors SA1 and SB1 are connected to both ends of this column.

Similarly, on the right side column, memory transistors T12, T22, ..., T82 of eight bits are serially connected, and select transistors SA2 and SB2 are connected to both ends of this column. Bit lines BL1 and BL2 are connected to ones of select transistors SA1 and SA2 at the external areas thereof, and each memory transistor has no bit contact.

The memory transistor has a stacked type gate electrode including a floating gate and a control gate, whereas the select transistor has a general single gate electrode. Eight word lines WL1, WL2, ..., WL8 are connected to the control gates of first- to eighth-row memory transistors. Select lines SG1 and SG2 are connected to the gates of the select transistors.

Write/erase of each memory transistor is performed by draining/injecting electrons through tunneling. A read operation is performed by using serially connected eight memory transistors as one unit. Therefore, as compared to a NOR type, an access speed is lower. However, since the number of bit contacts is small, integration degree can be raised.

In the NOR type EEPROM shown in FIG. 5B, similar to the NAND type, although a plurality of transistors T11, T21, ... are serially connected, the drains of memory transistors are connected to bit lines BL at every second bit and a source line SL is connected in common.

Data write is performed by applying a high electric field to the drain side and writing electrons into the floating gate through hot electron injection. Data erase is performed by draining electrons to the source line through tunneling.

In the NOR type EEPROM, each bit can be directly accessed so that an access time is short. However, since it is necessary to form one bit contact per two memory transistors, an occupied area becomes large and integration degree is inferior to the NAND type. Assuming the same cell capacity, it is generally said that the area of the NOR type is broader by about 20% than that of the NAND type.

If the threshold value of a channel region of a memory transistor is selectively changed and the stacked gate is changed to a single gate, a mask ROM can be formed. Similar to EEPROM, a NAND type and a NOR type of mask ROM can be formed.

A direct access to a transistor among a plurality of transistors requires a large substrate area and high integration is not easy.

SUMMARY OF THE INVENTION

It is an object of the present invention to provide a semiconductor device capable of directly accessing any one of a plurality of transistors and raising integration degree.

It is another object of the present invention to provide a semiconductor integrated circuit having a novel wiring pattern.

According to one aspect of the present invention, there is provided a semiconductor device comprising: a semiconductor substrate having a surface area of a first conductivity type; a field insulating film for defining a plurality of active regions disposed regularly in terms of two dimensions on a surface of the semiconductor substrate, each active region including one bit contact region and subsidiary active regions extending from the bit contact region in four directions; a plurality of first and second word lines, the plurality of first word lines extending as a whole in a first direction on the semiconductor substrate, the plurality of second word lines extending as a whole in a second direction on the semiconductor substrate, the first direction crossing the second direction, and in each active region two subsidiary active regions crossing the first word lines and remaining two subsidiary active regions crossing the second word lines; a plurality of bit lines crossing the first and second directions on the semiconductor substrate, each bit contact region being connected to a corresponding one of the bit lines; and an interlayer insulating region for insulating the first word lines, the second word lines, and the bit lines from one another.

Since the active region contains one bit contact region and subsidiary active regions extending in four directions from the bit contact region, four transistors can be connected to one bit contact. Since word lines connected to the gate electrodes of transistors extend in two directions crossing each other, four transistors connected to the common bit contact region can be independently accessed by selecting the word line.

The other end of each transistor may be connected in common in the semiconductor substrate to form a common source region, may be connected to a storage electrode of a memory capacitor, or may be connected to an external wiring line.

As above, four transistors connected to the common bit contact area can be accessed independently by different word lines. A semiconductor device having a high areal use factor can be realized. A semiconductor device having a novel structure can be provided.

DETAILED DESCRIPTION OF THE PREFERRED EMBODIMENTS

Figure 1D:
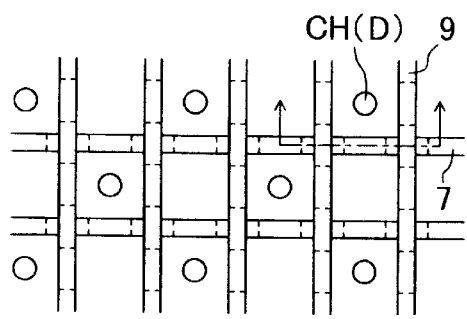
FIGS. 1AA to 1FA and FIGS. 1AB to 1FB are schematic plan views and cross sectional views illustrating manufacture processes of a flash EEPROM according to an embodiment of the invention.
Figure 1D:
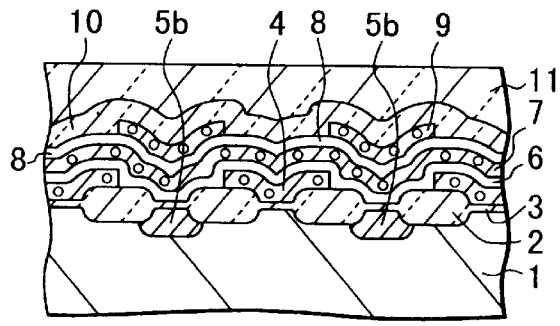

Embodiments of the invention will be described with reference to the accompanying drawings. A NOR type flash memory is used as an example in the following description.

As shown in FIG. 1AA, on the surface of a semiconductor substrate, a field oxide film 2 is formed to a thickness of, for example, about 400 nm through thermal oxidation using known selective oxidation techniques (LOCOS). The area where the field oxide film 2 is not formed becomes an active region. In the state shown in FIG. 1AA, four subsidiary active regions SAR extend from one drain region D, two regions SAR in the vertical direction and other two regions SAR in the horizontal direction. The other end of each subsidiary active region SAR is connected to a common source region CS extending obliquely in two different directions. In this specification, the drain region means a region where a bit line is connected and the source region means a region facing the drain region via a gate electrode.

After the field oxide film is formed, a nitride film used as an oxidation mask and a buffer oxide film are removed. On an exposed active region, a tunnel oxide film is grown to a thickness of, for example, about 9.5 nm through thermal oxidation.

FIG. 1AB is a cross sectional view taken along a dotted broken line of FIG. 1AA. The field oxide film (FOX) 2 is formed in the surface layer of a p-type silicon region 1, and the tunnel oxide film 3 is formed in an area where the field oxide film 2 was not formed. The p-type silicon region 1 may be a semiconductor substrate itself or a p-type well formed in a semiconductor substrate. Instead of selective oxidation, trench separation may be used for forming the element isolation region.

Next, a polysilicon layer is grown on the substrate surface to a thickness of, for example, about 130 nm, the polysilicon layer being used for forming floating gates of flash memories. A resist pattern is formed on the polysilicon layer to pattern the latter.

FIG. 1BA is a plan view showing patterned floating gates. FIG. 1BB is a cross sectional view taken along a dotted broken line of FIG. 1BA. Each floating gate (FG) 4 traverses a corresponding one of the subsidiary active regions SAR at the midst thereof, the regions SAR extending from each drain region D (bit contact region BC) in four different directions. The region opposite to the drain region D relative to the floating gate 4 is a source region S. The source regions S are connected by a common source region CS.

As shown in FIG. 1BB, after the floating gates are patterned, by using the floating gates as a mask, n-type impurities e.g., As$^+$ ions are implanted into the substrate to form n-type regions 5a and 5b of the source/drain regions of each memory cell transistor. The n-type impurity doped region 5a is the drain region and the n-type impurity doped region 5b is the source region S.

The n-type region 5a of the drain region D is being formed between a pair of floating gates 4, and the n-type regions 5b of a pair of source regions S are being formed in the regions opposite to the drain regions relative to the floating gate 4, in FIG. 1BB. The common source region CS doped with impurities electrically connects the source regions S of all transistors in common.

In order to raise a source breakdown voltage during the data erase, it is preferable to form a low impurity concentration region in the source region. Alternatively, a gentle gradient of impurity concentration may be formed. For this purpose, only the drain region is covered with a resist pattern, and impurities having a large diffusion coefficient such as phosphorous are doped only in the source region. The doped impurity diffuses widely to form a gentle concentration gradient.

After the floating gates are formed, an ONO (oxide-nitride-oxide) film is formed which is used as an insulating film between the floating gate and control gate. For example, the ONO film is formed by growing an oxide film to a thickness of 6.5 nm through thermal oxidation, a nitride film to a thickness of 12 nm through CVD and an oxide film to a thickness of 4 nm through thermal oxidation.

Thereafter, word lines (control gates) of two types crossing each other are formed. In order to form crossed wiring lines, wiring layers are required at two levels. As ones of control gates (word lines), a polysilicon film is deposited on the substrate surface to a thickness of about 400 nm by CVD and patterned by using a resist pattern.

FIG. 1CA shows a state of ones of patterned word lines 7. Each word line 7 is being formed over the horizontal floating gates 4H disposed in a horizontal direction to form a stacked type gate structure. The word line is not formed over the vertical floating gates 4V. The vertical floating gate 4V is covered with the ONO film or an ONO film whose upper oxide film is etched when the control gates are patterned.

FIG. 1CB is a cross sectional view taken along a dotted broken line of FIG. 1CA. The insulating film (ONO film) 6 is formed on the floating gates 4, and the word line 7 is being formed on the insulating film 6.

After the ones of the word lines 7 are formed, in order to insulate the others of word lines, the surfaces of already formed word lines are thermally oxidized. For example, the surface of the polysilicon word line 7 is thermally oxidized to form an oxide film of about 180 nm in thickness. Even if this thermal oxidation consumes or vanishes the upper oxide film of the ONO film on the floating gate 4, a new oxide film is formed thereon. The nitride film of the ONO film is mainly oxidized to a thickness approximately equal to that of the initially formed upper oxide film.

Thereafter, a polysilicon film to be used for the others of word lines is deposited and patterned by using a resist pattern.

FIG. 1DA is a schematic diagram showing the others of word lines 9 formed by the above method. The others of word lines 9 are formed which cross, over the oxide film, the ones of word lines 7 extending in the horizontal direction and extend in the vertical direction overlapping the vertical direction floating gates via the ONO film.

FIG. 1DB is a cross sectional view taken along a dotted broken line of FIG. 1DA. Changing from the state shown in FIG. CB, an oxide film 8 is formed on the word line 7, and the word line 9 is formed on the oxide film 8. In FIG. 1DB, interlayer insulating film to be later formed is also shown. After the others of word lines 9 are formed, for example a CVD oxide film 10 is deposited to a thickness of about 120 nm and a borophosphosilicate glass (BPSG) film 11 is deposited on the CVD oxide film 10 to a thickness of about 900 nm. Thereafter, the BPSG film 11 is reflowed by heat treatment and etched back by about 300 nm to planarize the surface thereof. In the above manner, the interlayer insulating film 10 and 11 is formed. After the interlayer insulating film is formed, a contact hole CH is formed through the interlayer insulating film in an area corresponding to each drain region, the contact hole reaching the surface of the drain region. Positions of contact holes CH are shown in FIG. 1DA.

Figure 1E:
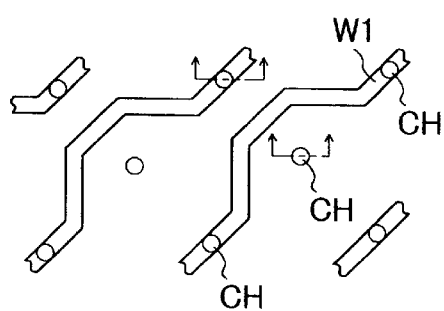
Figure 1E:
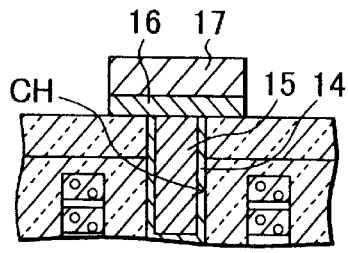

As shown in FIG. 1EB, in order to form a connection plug in the contact hole, first a conductive nitride layer 14 for adhesion, e.g., a titanium nitride layer, is formed to a thickness of about 50 nm, and a metal layer 15 of tungsten or the like is grown on the conductive nitride layer 14 to a thickness of, for example, about 800 nm by CVD or the like. Thereafter, an etch-back process is performed to fill the conductive film (W layer and TiN layer) in the contact hole CH and remove the conductive film on the flat surface.

Next, for example, a titanium nitride layer 16 is formed as a barrier layer to a thickness of about 50 nm, and an aluminum alloy layer 17 as a main conductive layer is deposited on the titanium nitride layer 16 to a thickness of about 600 nm. A resist pattern is formed on the aluminum alloy layer 17 to etch the underlying aluminum alloy layer 17 and titanium nitride layer 16 and pattern first bit wiring lines.

FIG. 1EA shows an example of the pattern of the first bit wiring lines W1 formed in the above manner. As shown, the first bit wiring line W1 extends obliquely in a lower left (leftwardly descending) direction (45 degrees) and is connected to every second contact hole disposed along the line extension direction, in place of being connected to all contact holes. This layout is used in order to avoid the operation that if all contact holes disposed along the line extension direction are connected to the first wiring line, one bit line and one word line select two transistors at the same time.

Figure 1F:
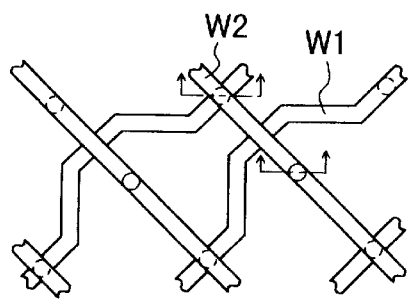
Figure 1F:
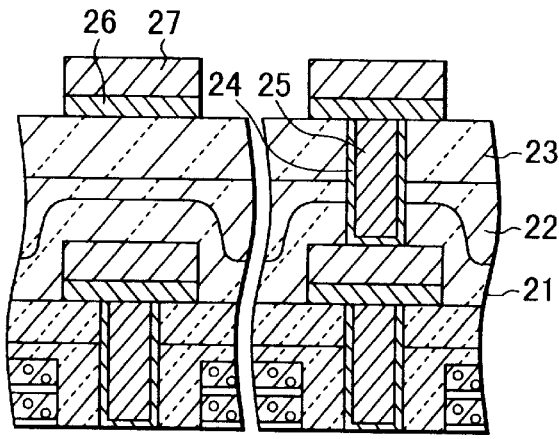

As shown in FIG. 1FB, on the surface of the substrate formed with the first bit wiring lines, a CVD oxide film 21 is deposited to a thickness of about 600 nm, and a spin-on-glass (SOG) film 22 is formed on the CVD oxide film 21 to a thickness of about 400 nm. The SOG film is etched back by about 200 nm to planarize the surface thereof. On the surface of the SOG film 22, a CVD oxide film 23 is deposited to a thickness of about 500 nm. In this manner, interlayer insulating film is formed. Thereafter, a new contact hole is formed through the interlayer insulating film in an area corresponding to the contact hole CH not connected to the first bit wiring line W1.

FIG. 1FA shows newly formed contact holes indicated by solid lines. After the contact holes are formed, similar to the case of forming the first bit wiring lines, a conductive nitride layer 24 for adhesion, e.g., a titanium nitride layer, is formed to a thickness of about 50 nm, and a metal layer 25 of tungsten or the like is grown on the conductive nitride layer 24 to a thickness of, for example, about 800 nm. Thereafter, an etch-back process is performed to form embedded plugs 24 and 25 in the contact holes.

A nitride titanium layer 26 is formed on the surface of the CVD oxide film 23 to a thickness of about 50 nm, the nitride titanium layer covering the connection plugs. An aluminum alloy layer 27 is formed on the titanium nitride layer 26 to a thickness of about 600 nm. A resist pattern is formed on the aluminum alloy layer 27 to pattern a second bit wiring line W2 as a second bit line.

FIG. 1FA shows the layout of second bit wiring lines. The second bit line extends obliquely in a lower right (rightwardly descending) direction (45 degrees). This second bit line is also connected to every second bit contact regions in the line extension direction. Since the bit contact region not connected is covered with the interlayer insulating film, the second bit line can be disposed linearly.

After an interlayer insulating film is formed covering the second bit wiring lines and other necessary wiring lines are formed, the substrate surface is covered with an insulating film and a protective film. With the processes described above, a flash type semiconductor memory device capable of independently accessing each bit and having high integration degree can be manufactured.

Figure 2:
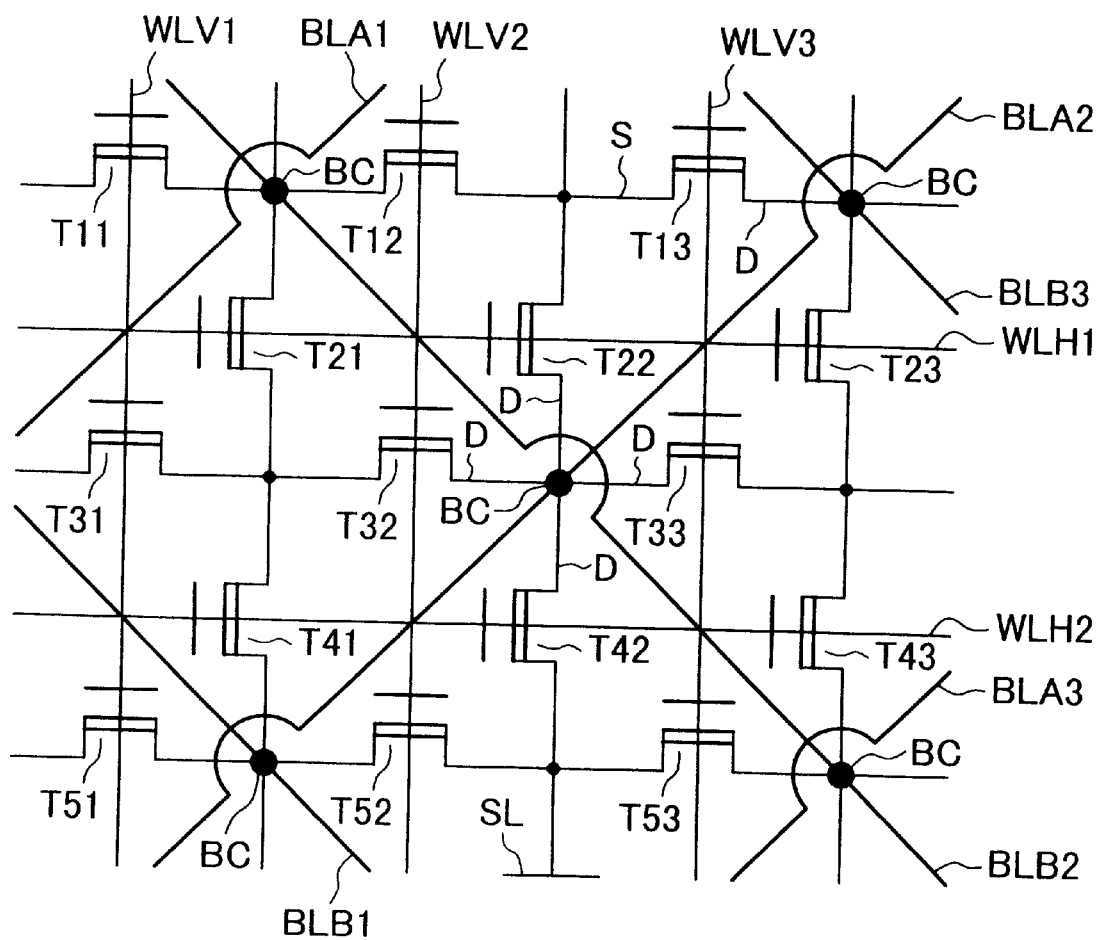
FIG. 2 is an equivalent circuit diagram of a semiconductor device manufactured by the processes shown in FIGS. 1AA to 1FB.

FIG. 2 is an equivalent circuit of a flash type semiconductor memory device manufactured by the above embodiment method.

In FIG. 2, bit contact regions BC are disposed in a staggered lattice form. Four transistors are connected to each bit contact region BC, two transistors in the horizontal direction and the other two transistors in the vertical direction. The other end of each transistor has a configuration of four transistors connected together. Although not shown, the other ends of four transistors are connected in common to the source line SL.

First row transistors T11, T12 and T13 are serially connected in the horizontal direction. Second row transistors T21, T22 and T23 are disposed vertically and driven by a common word line WLH1. Third row transistors T31, T32 and T33 are connected in a similar manner to the first row transistors, and fourth row transistors T41, T42 and T43 are connected in a similar manner to the second row transistors. Vertically disposed transistors, e.g., transistors T21 and T41 are serially connected.

Vertical word lines WLV1, WLV2 and WLV3 control the horizontally disposed control gates of odd row transistors, and horizontal word lines WLH1, WHL2, . . . control vertically disposed control gates of even row transistors. A first group of bit lines BLA1, BLA2, . . . connects every second bit contact regions disposed in a lower left direction. A second group of bit lines BLB1, BLB2, BLB3, . . . connects every second bit contact regions BC disposed in a lower right direction.

In this embodiment, each of four transistors connected to one bit contact region BC can be accessed independently by using two types of crossed word lines. Bit lines are also constituted of two types of crossed bit lines so that a sufficient margin of a wiring pitch can be obtained. The whole layout is highly symmetrical. An integration degree of a semiconductor integrated circuit device is expected to be determined by a bulk process which determines how small each active region can be defined by the field insulating film.

Figure 3A:
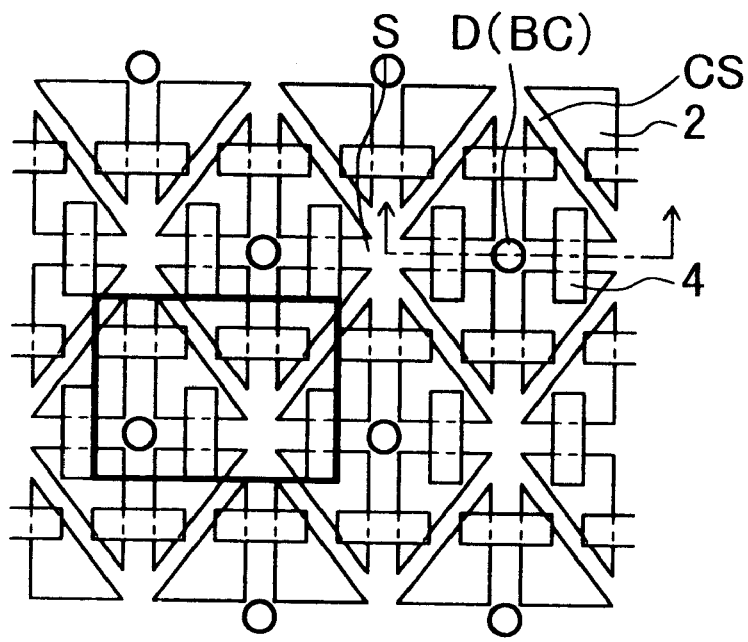
FIGS. 3A and 3B are schematic plan views comparing areal use factors of a semiconductor device manufactured by the processes shown in FIGS. 1AA to 1FB and a conventional semiconductor device.
Figure 3B:
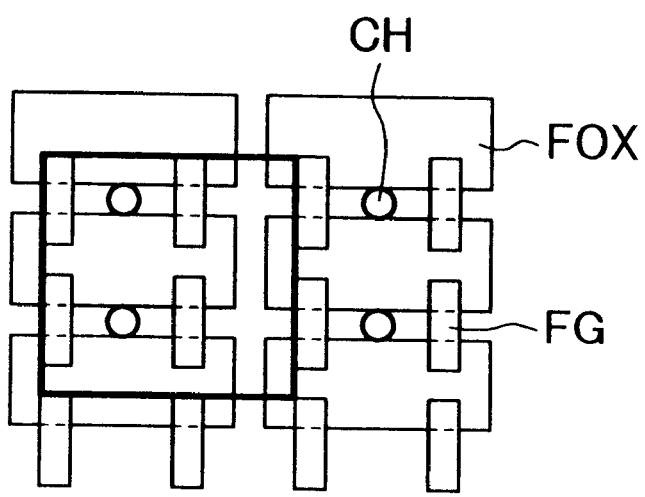

FIGS. 3A and 3B are schematic plan views comparing semiconductor substrate areas occupied by an embodiment semiconductor device and a conventional semiconductor device. FIG. 3A shows the embodiment device, and FIG. 3B shows a NOR type flash memory according to conventional techniques. In FIGS. 3A and 3B, an area surrounded by a bold black frame corresponds to an area occupied by four bits.

It can be understood from the comparison between FIGS. 3A and 3B that the occupied area can be reduced by about 25% of the area occupied by the conventional NOR type memory device. A general NOR type circuit has an occupied area broader by about 20% than a general NAND type circuit. Therefore, the occupied area of a NOR type flash EEPROM circuit of the embodiment has an occupied area smaller than even a general NAND circuit.

In the above embodiment, after floating gates disposed in the vertical and horizontal directions are formed, two types of word lines are formed by different processes. With this method, a position alignment between floating gates and word lines may pose a problem in some cases. If a margin is set unnecessarily wide, an unnecessary offset may be incorporated in the source/drain diffusion region, which may change the electrical characteristics.

Next, an embodiment of patterning floating gates and control gates by the same process will be described.

Figure 4A:
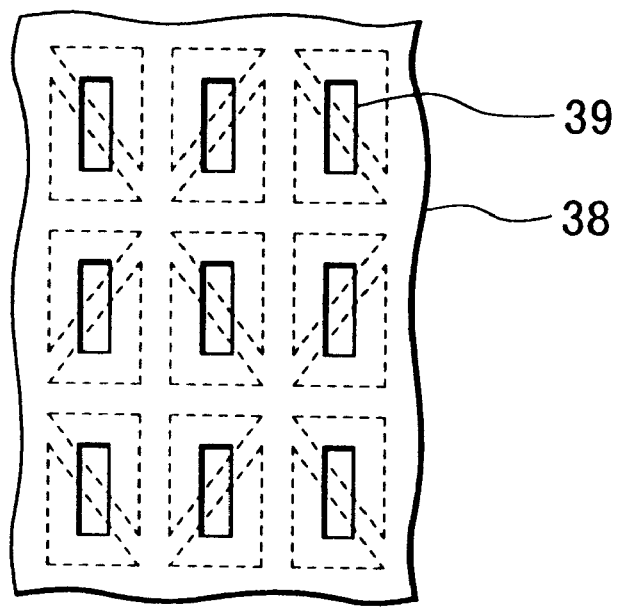
FIGS. 4A and 4B are schematic plan views illustrating another embodiment of the invention.

After a field insulating film and a tunnel oxide film are formed at the process shown in FIGS. 1AA and 1AB, a polysilicon layer is formed on the substrate surface, the polysilicon layer being used to form floating gates on the substrate surface. A resist pattern 38 shown in FIG. 4A is formed on the surface of the polysilicon layer. This resist pattern 38 has openings 39 only in areas where two types of word lines to be later formed cross each other. By using this resist pattern as a mask, the polysilicon layer is etched. By removing the polysilicon layer in these areas, floating gates, when patterned together with the control gates will be electrically separated.

In this state, $As^+$ ions are implanted into active regions exposed in the openings to thereby form an impurity doped region partially in the common source region to be later formed. This ion implantation into the area where two types of word lines cross each other, is performed because it cannot be performed at a later process stage.

Figure 4B:
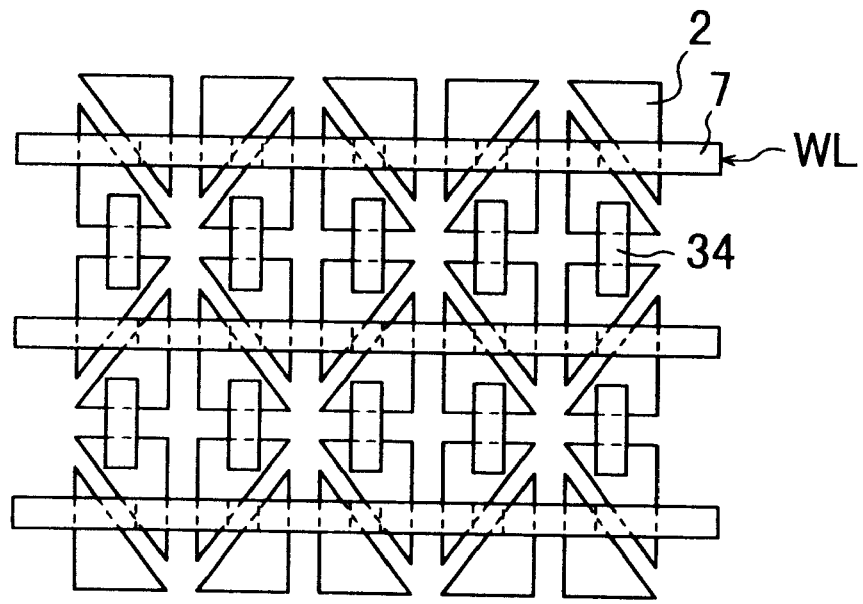
Figure 5B:
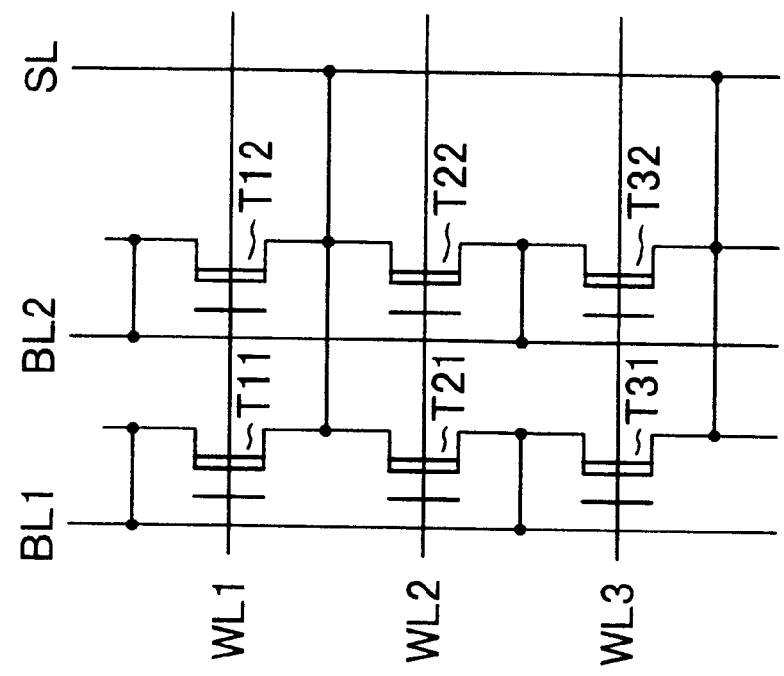
FIGS. 5A and 5B are equivalent circuit diagrams of conventional NAND type flash EEPROM and NOR type flash EEPROM.
Figure 5A:
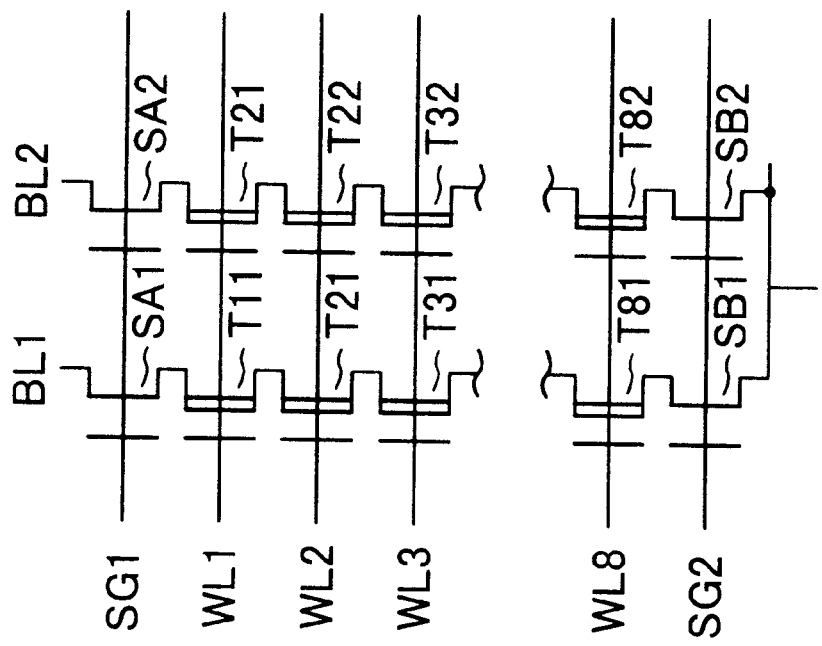

After the resist pattern is removed, an ONO film is formed on the polysilicon layer to be used for floating gates. For example, the ONO film is formed by growing an oxide film to a thickness of 6.5 nm through thermal oxidation, a nitride film to a thickness of 12 nm through CVD and an oxide film to a thickness of 4 nm through thermal oxidation. On this ONO film, a second polysilicon layer or a silicide layer to be used for one type of word lines is formed to a thickness of about 400 nm. As shown in FIG. 4B, a resist pattern is formed on the second polysilicon layer to pattern the second and first polysilicon layers and form one type of word lines 7 and stacked gate electrodes partially along a direction crossing the word lines 7.

Since the openings are formed in word line crossing areas at the process shown in FIGS. 4A and 4B, under the horizontally extending word lines 7, floating gates are divided individually. Since the floating gates and horizontally extending word lines 7 are formed by the same patterning process, the position precision of active regions is high in a current flowing direction. Furthermore, since the stacked gate electrodes 34 including two polysilicon layers are formed by one patterning process, the position precision thereof is also high in the current flowing direction. The stacked gate electrodes 34 extending vertically may be formed longer than necessary length, by taking into consideration the position alignment margin for the word lines to be formed later over the electrodes.

At the stage shown in FIG. 4B, impurities for forming source/drain regions, e.g., $As^+$ ions are implanted. In this case, although the ions are not implanted into the common source region covered by the word lines 7, impurities were already doped at the stage shown in FIG. 4A so that the common source region as a whole is electrically connected.

Thereafter, an interlayer insulating film is formed covering the word lines 7 and stacked gate electrodes 34. For example, a CVD oxide film is formed about 100 nm thick and an SOG film is formed about 900 nm thick. After the SOG film is etched back to planarize the surface thereof, openings are formed through the interlayer insulating film to expose the vertically disposed stacked gate electrodes 34. A third polysilicon layer or a silicide layer is formed on the interlayer insulating film to a thickness of, for example, about 400 nm. The third polysilicon layer is patterned by using a resist pattern to form vertical word lines such as shown in FIG. 1DA.

Thereafter, similar to the embodiment described earlier, a CVD oxide film is deposited about 100 nm thick and a BPSG film is deposited 900 nm thick. The BPSG film is reflowed by thermal annealing and etched back by about 300 nm to planarize the surface thereof. Similar to the previous embodiment, contact holes are formed and bit wiring lines are formed.

In this embodiment, a flash EEPROM device is formed which has stacked gate electrodes having a floating gate and a control gate. If a floating gate is not formed and ions are implanted into channel regions under selected gate regions by using a resist pattern having openings corresponding to the selected channel regions, then a mask ROM device having channel regions having two different threshold voltages can be formed.

For example, a resist pattern is formed which has openings corresponding to only those regions where "1" or "0" is stored, the regions being selected from regions of the floating gates 4 shown in FIG. 1BA. By using this resist pattern as a mask, ions are implanted to write an on/off state of each transistor. Instead of selective ion implantation, selective etching or the like may be used for controlling the threshold voltage. After the threshold voltage is controlled, word lines serving as the gate electrodes are formed and bit lines are formed in a manner similar to the above-described embodiments.

In the above embodiments, two types of crossed bit lines are formed. Bit lines may be formed by using a single wiring layer. Bit lines made of a single wiring layer simplify manufacture processes.

Figure 6A:
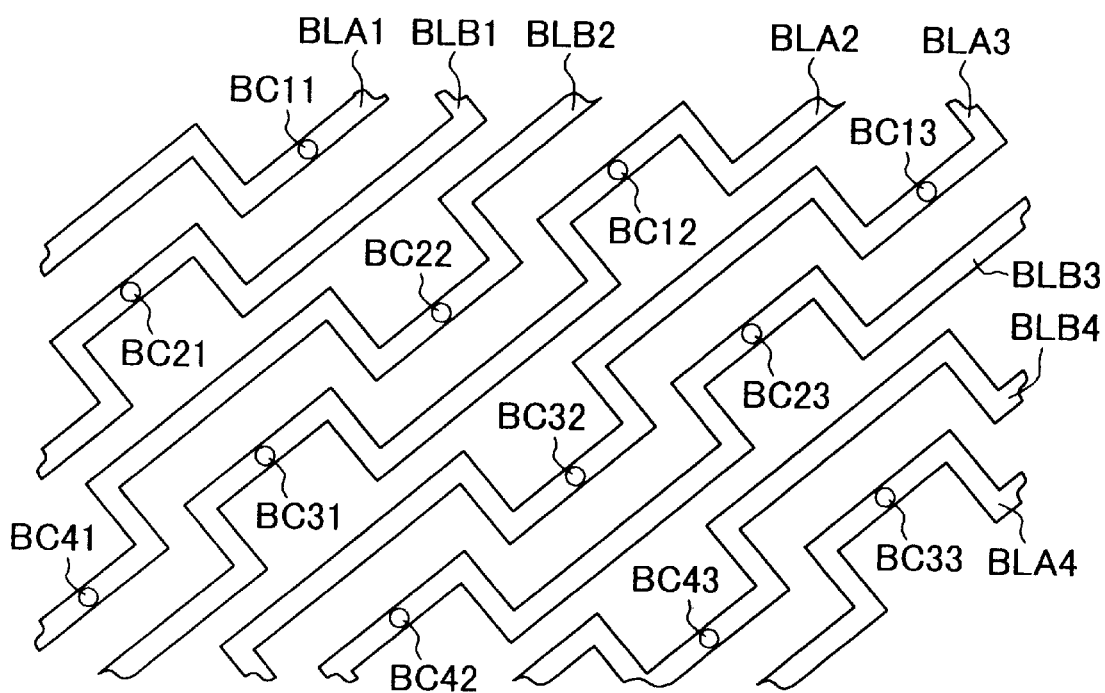
FIGS. 6A and 6B are schematic plan views illustrating the layout of bit lines according to another embodiment of the invention.
Figure 6B:
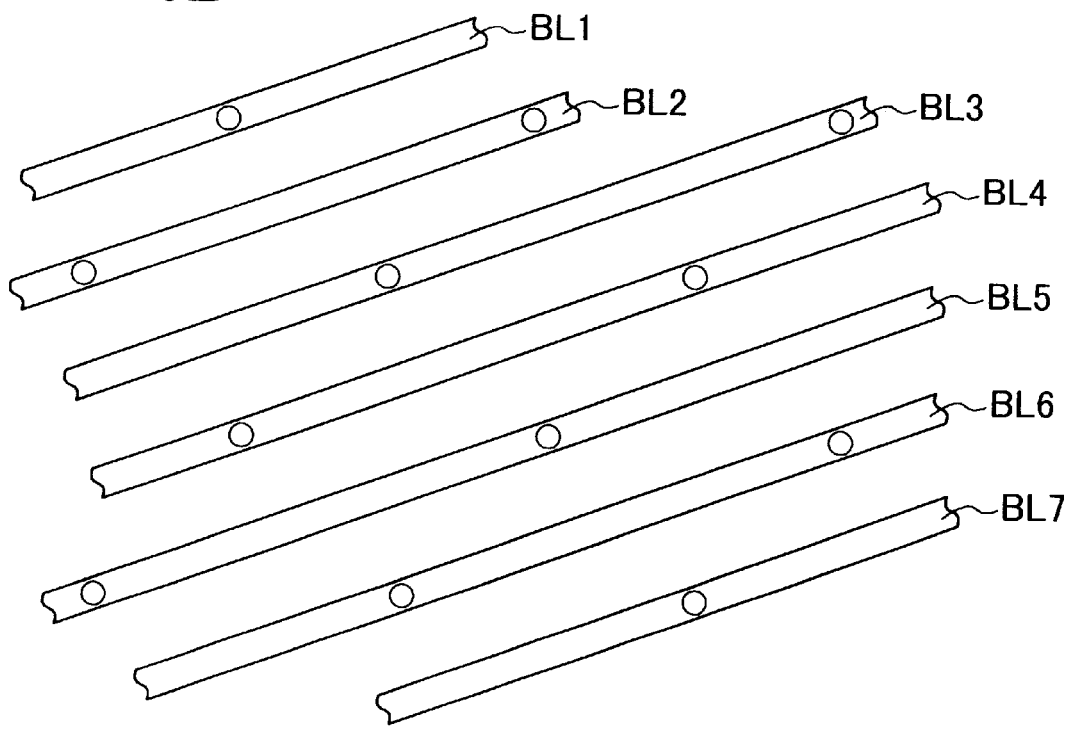

FIGS. 6A and 6B are schematic plan views of bit lines made of a single wiring layer.

In the layout shown in FIG. 6A, bit lines extend as a whole in a lower left direction at an angle of about 45 degrees. First type bit lines BLA1, BLA2, . . . are connected to odd row bit contact regions, such as first row bit contact regions BC11, BC12 and BC13 and third row bit contact regions BC31, BC32 and BC33 as shown in FIG. 6A.

Second type bit lines BLB1, BLB2, BLB3 and BLB4 are connected to even row bit contact regions, such as second row bit contact regions BC21, BC22 and BC23 and fourth row bit contact regions BC41, BC42 and BC43 as shown in FIG. 6A. Nearest bit contact regions disposed in the lower left direction are not connected to the same bit line, so that each transistor can be accessed independently. The layout of bit lines in the lower left direction may be changed in the lower right direction.

In the layout shown in FIG. 6B, all bit lines BL1, BL2, . . . are of the same type. If the bit line BL is disposed at an angle of about 45 degrees, each transistor cannot be accessed independently. Therefore, bit lines BL are disposed so that bit contact regions spaced by one unit in the vertical direction and three units in the horizontal direction can be connected by a same bit line.

Although bit lines are disposed at an angle slanted toward the horizontal direction more than 45 degrees, they may be disposed at an angle slanted toward the vertical direction more than 45 degrees. The layout of bit lines in the lower left direction may be changed in the lower right direction. In this layout shown in FIG. 6B, each bit line selects one bit contact region from each row and is connected thereto.

In the above embodiment, the drain regions of four transistors are connected in common, and although the gate electrodes of the four transistors are driven by different word lines, the common source region is used for the four transistors. The source region of each transistor may be electrically separated, eliminating the use of the common source region.

Figure 7A:
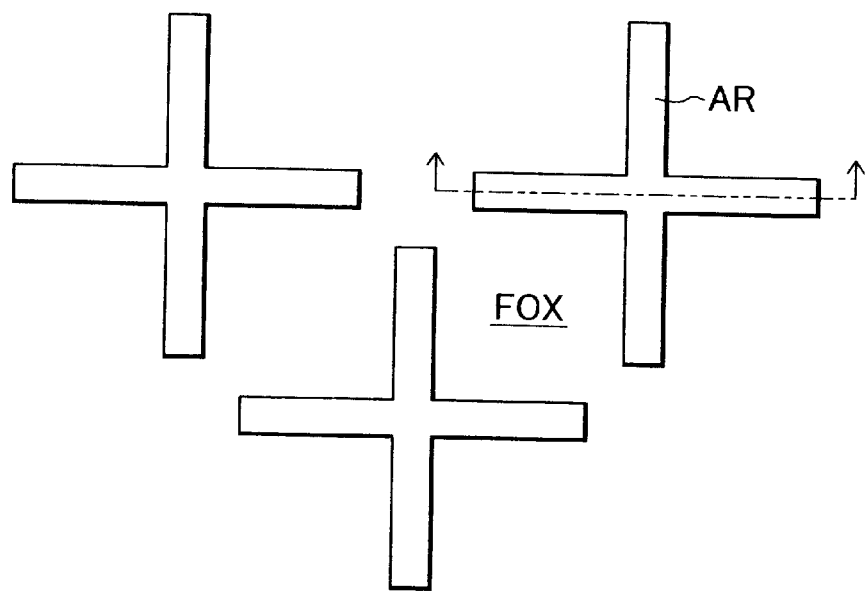
FIGS. 7A and 7B are schematic plan and cross sectional views showing the structure of a semiconductor device according to another embodiment of the invention.
Figure 7B:
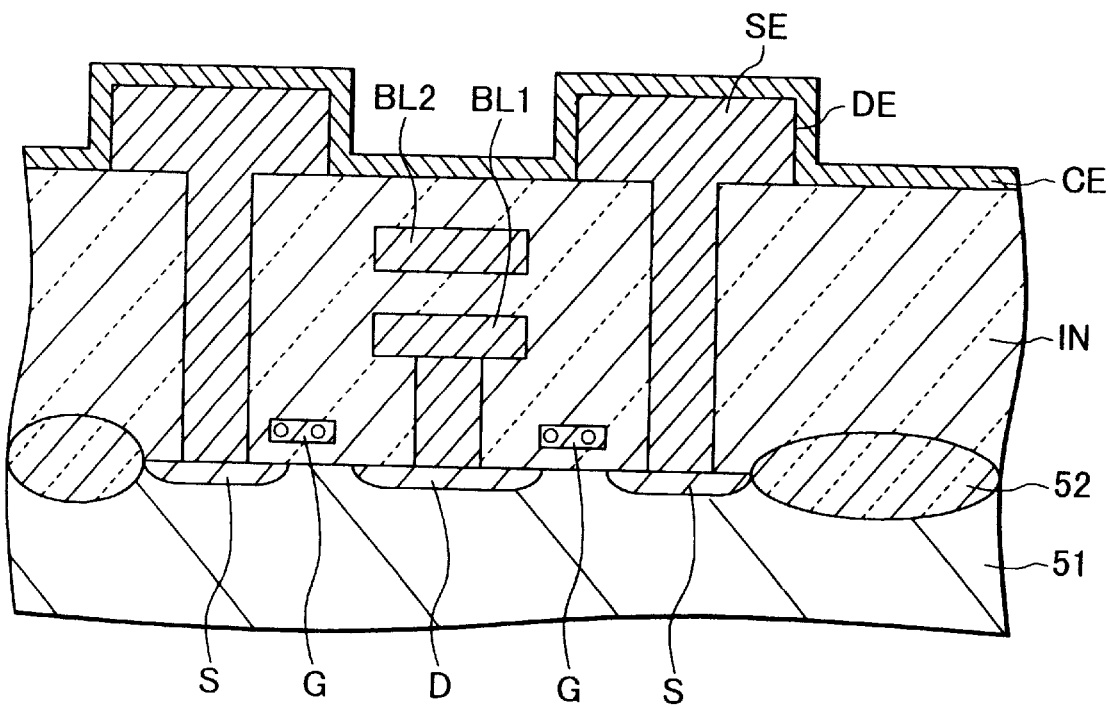

FIGS. 7A and 7B are schematic plan and cross sectional views showing the structure of a DRAM device.

FIG. 7A schematically shows a pattern of an active region defined by a field oxide film. A plurality of active regions AR are disposed in a staggered lattice configuration. Each active region AR has a cross shape. A crossed area of a cross shape is used as a common drain region and four end portions are independent source regions. If a storage capacitor is connected to each source region and a common electrode is formed via a capacitor dielectric film, a memory capacitor can be connected to each source region.

FIG. 7B is a schematic cross sectional view of a DRAM device. An active region is defined by a field oxide film 52 formed on the surface of a semiconductor substrate 51. Two gate electrodes G are formed on both sides of a central drain region D, and two source regions S are formed in areas opposite to the drain region D relative to the gate electrodes G. The drain region D is connected to a bit line BL1. The source region S is connected to a storage electrode SE of a memory capacitor. The storage electrode SE faces a common electrode CE via a capacitor dielectric film DE to form a memory capacitor.

In the DRAM device shown in FIG. 7B, a second bit line BL2 is formed in an interlayer insulating film IN which covers the surface of the semiconductor substrate 51, these first and second bit lines BL1 and BL2 corresponding to those shown in FIG. 1FA. If bit lines are to be formed to have the layout shown in FIG. 6A or 6B, the second bit line BL2 is omitted and all bit lines are formed by a single wiring layer.

The present invention has been described in connection with the preferred embodiments. The invention is not limited only to the above embodiments. For example, in the structure shown in FIG. 7B, the capacitor storage electrode SE may be replaced by a wiring pattern in which the common electrode CE is omitted and the drain and source regions of each transistor are connected to wiring patterns. In this case, a mask ROM may be formed by selectively implanting ions in channel regions under the gate electrodes G. The gate electrode G may be a stacked gate electrode of a floating gate and a control gate.

A memory circuit and a peripheral circuit may be formed by using a semiconductor substrate having a well structure. Although two types of word lines extending in different directions cross each other at a right angle, the word lines may be disposed other than at a right angle and may be curved or bent at a cross point or at an intermediate position. This case is included in the concept that "lines extend as a whole in a certain direction". Bit lines may be formed similarly. It will be apparent to those skilled in the art, that various modifications, improvements, combinations, and the like can be made.

What is claimed is:

1. A semiconductor device comprising:
    a semiconductor substrate having a surface area of a first conductivity type;
    a field insulating film for defining a plurality of active regions disposed regularly in terms of two dimensions on a surface of the semiconductor substrate, each active region including one bit contact region and subsidiary active regions extending from the bit contact region in four directions, the field insulating film also defining a common active region for connecting in common, ends of subsidiary active regions opposite to the bit contact region;
    a plurality of first and second word lines, the plurality of first word lines extending as a whole in a first direction on the semiconductor substrate, the plurality of second word lines extending as a whole in a second direction on the semiconductor substrate, the first direction crossing the second direction, and in each active region two subsidiary active regions crossing the first word lines and remaining two subsidiary active regions crossing the second word lines;
    a plurality of bit lines crossing the first and second directions on the semiconductor substrate, each bit contact region being connected to a corresponding one of the bit lines; and
    an interlayer insulating region for insulating the first word lines, the second word lines, and the bit lines from one another.

2. A semiconductor device according to claim 1, wherein the plurality of bit lines extend as a whole in a same direction.

3. A semiconductor device according to claim 2, wherein each of the plurality of bit lines extending along said third or fourth direction is connected to every second bit contact region disposed along said third or fourth direction.

4. A semiconductor device according to claim 2, wherein one bit contact region and a nearest bit contact region disposed along said same direction are connected to different bit lines.

5. A semiconductor device according to claim 4, further comprising a floating gate electrode disposed between each subsidiary active region and a corresponding word line at a position where the subsidiary active region crosses the word line, wherein the semiconductor device is a non-volatile semiconductor memory.

6. A semiconductor device according to claim 2, wherein each of the plurality of bit lines is connected to every second bit contact region.

7. A semiconductor device comprising:
    a semiconductor substrate having a surface area of a first conductivity type;
    a field insulating film for defining a plurality of active regions disposed regularly in terms of two dimensions on a surface of the semiconductor substrate, each active region including one bit contact region and subsidiary active regions extending from the bit contact region in four directions;
    a plurality of first and second word lines, the plurality of first word lines extending as a whole in a first direction on the semiconductor substrate, the plurality of second word lines extending as a whole in a second direction on the semiconductor substrate, the first direction crossing the second direction, and in each active region two subsidiary active regions crossing the first word lines and remaining two subsidiary active regions crossing the second word lines;
    a plurality of bit lines crossing the first and second directions on the semiconductor substrate, each bit contact region being connected to a corresponding one of the bit lines, the plurality of bit lines extending as a whole in third and fourth directions crossing each other; and an interlayer insulating region for insulating the first word lines, the second word lines, and the bit lines from one another.

8. A semiconductor device according to claim 7, wherein each of the plurality of bit lines extending along said third or fourth direction is connected to every second bit contact region disposed along said third or fourth direction.

9. A semiconductor device comprising:

a semiconductor substrate having a surface area of a first conductivity type;

a field insulating film for defining a plurality of active regions disposed regularly in terms of two dimensions on a surface of the semiconductor substrate, each active region including one bit contact region and subsidiary active regions extending from the bit contact region in four directions;

a plurality of first and second word lines, the plurality of first word lines extending as a whole in a first direction on the semiconductor substrate, the plurality of second word lines extending as a whole in a second direction on the semiconductor substrate, the first direction crossing the second direction, and in each active region two subsidiary active regions crossing the first word lines and remaining two subsidiary active regions crossing the second word lines;

a plurality of bit lines crossing the first and second directions on the semiconductor substrate, each bit contact region being connected to a corresponding one of the bit lines; and an interlayer insulating region for insulating the first word lines, the second word lines, and the bit lines from one another;

wherein one bit contact region and a nearest bit contact region disposed along the same direction are connected to different bit lines.

10. A semiconductor device according to claim 7, wherein the plurality of bit lines extend as a whole in third and fourth directions crossing each other.

11. A semiconductor device according to claim 7, wherein the plurality of bit lines extend as a whole in a same direction.

12. A semiconductor device according to claim 10, wherein each of the plurality of bit lines extending along said third or fourth direction is connected to every second bit contact region disposed along said third or fourth direction.

13. A semiconductor device according to claim 11, wherein each of the plurality of bit lines is connected to every second bit contact region.

14. A semiconductor device according to claim 1, wherein the plurality of bit lines extend as a whole in third and fourth directions crossing each other.

* * * * *